(12) United States Patent
Park et al.

(10) Patent No.: US 10,946,765 B2
(45) Date of Patent: Mar. 16, 2021

(54) VEHICLE AND METHOD FOR MANAGING BATTERY THEREOF

(71) Applicants: Hyundai Motor Company, Seoul (KR); Kia Motors Corporation, Seoul (KR)

(72) Inventors: Man Jae Park, Gyeonggi-do (KR); Joong Woo Lee, Gyeonggi-do (KR); Myung Won Lee, Gyeonggi-do (KR)

(73) Assignees: Hyundai Motor Company, Seoul (KR); Kia Motors Corporation, Seoul (KR)

(*) Notice: Subject to any disclaimer, the term of this patent is extended or adjusted under 35 U.S.C. 154(b) by 224 days.

(21) Appl. No.: 15/824,213

(22) Filed: Nov. 28, 2017

(65) Prior Publication Data

US 2018/0172777 A1    Jun. 21, 2018

(30) Foreign Application Priority Data

Dec. 15, 2016 (KR) .................. 10-2016-0171629

(51) Int. Cl.
*H02J 7/00* (2006.01)
*B60L 58/13* (2019.01)
(Continued)

(52) U.S. Cl.
CPC .............. *B60L 58/13* (2019.02); *B60L 3/12* (2013.01); *B60L 58/16* (2019.02); *G01R 31/392* (2019.01);
(Continued)

(58) Field of Classification Search
USPC ........................................... 320/132
See application file for complete search history.

(56) References Cited

U.S. PATENT DOCUMENTS

| 7,521,935 B2* | 4/2009 | Uchida | G01R 31/3842 324/426 |
| 8,515,700 B2* | 8/2013 | Oh | G01R 31/392 702/63 |

(Continued)

FOREIGN PATENT DOCUMENTS

| JP | 2005-051920 A | 2/2005 |
| JP | 2007-195312 A | 8/2007 |

(Continued)

*Primary Examiner* — Samuel Berhanu
(74) *Attorney, Agent, or Firm* — Mintz Levin Cohn Ferris Glovsky and Popeo, P.C.; Peter F. Corless

(57) ABSTRACT

A vehicle and method are provided in which deterioration of a battery is controlled. The method includes detecting deterioration severity of the battery and determining whether the deterioration severity is equal to or greater than a reference value. A cause of battery deterioration is determined when the deterioration severity is equal to or greater than the reference value. The method further includes determining whether the cause of the battery deterioration is vehicle driving and reducing an SOC management range of the battery when the cause of deterioration of the battery is charging/discharging due to vehicle driving. The deterioration cause of the battery is determined as a state of the vehicle left unattended and the central SOC of the battery is adjusted when the cause of deterioration of the battery is not charging/discharging due to vehicle driving.

19 Claims, 5 Drawing Sheets

(51) Int. Cl.
*H02J 7/04* (2006.01)
*H01M 10/48* (2006.01)
*G01R 31/392* (2019.01)
*H02J 7/14* (2006.01)
*B60L 3/12* (2006.01)
*B60L 58/16* (2019.01)
*H01M 10/42* (2006.01)

(52) U.S. Cl.
CPC ........... *H01M 10/48* (2013.01); *H02J 7/0047* (2013.01); *H02J 7/04* (2013.01); *H02J 7/1461* (2013.01); *B60L 2240/54* (2013.01); *B60L 2240/80* (2013.01); *H01M 2010/4271* (2013.01); *H01M 2220/20* (2013.01); *H02J 7/0048* (2020.01); *Y02T 10/70* (2013.01)

(56) References Cited

U.S. PATENT DOCUMENTS

| | | | |
|---|---|---|---|
| 2009/0295332 A1* | 12/2009 | Yang | H02J 7/0029 320/132 |
| 2010/0244781 A1* | 9/2010 | Kramer | H02J 7/0016 320/162 |
| 2012/0200257 A1* | 8/2012 | Schwarz | H01M 10/42 320/109 |
| 2014/0167680 A1* | 6/2014 | Park | B60L 3/0046 320/104 |

FOREIGN PATENT DOCUMENTS

| | | |
|---|---|---|
| JP | 2009-500603 A | 1/2009 |
| JP | 2011-010465 A | 1/2011 |
| JP | 2011-044346 A | 3/2011 |
| JP | 2012-074342 A | 4/2012 |
| JP | 2013-089424 A | 5/2013 |
| JP | 2015-142492 A | 8/2015 |

\* cited by examiner

US 10,946,765 B2

VEHICLE AND METHOD FOR MANAGING BATTERY THEREOF

CROSS-REFERENCE TO RELATED APPLICATION(S)

This application claims the benefit of Korean Patent Application No. 10-2016-0171629, filed on Dec. 15, 2016, which is hereby incorporated by reference as if fully set forth herein.

BACKGROUND

Field of the Invention

The present invention relates to a vehicle and, more specifically, to a vehicle that controls deterioration of a battery mounted within the vehicle and a method for managing the battery of the vehicle.

Discussion of the Related Art

In hybrid vehicles, a high-voltage battery charges and discharges electrical energy and performance of the battery may deteriorate due to chemical degradation, distinguished from general mechanical parts. Chemical degradation of a battery is caused by deterioration due to charging and discharging and deterioration due to negligence without charging and discharging. A method of using the battery to suppress such deterioration may depend on the cause of deterioration. Accordingly, when deterioration of a high-voltage battery applied to a hybrid vehicle occurs, a management strategy for suppressing additional deterioration by estimating a major cause of deterioration is required.

SUMMARY

An object of the present invention is to provide a vehicle which minimizes deterioration of a battery thereof by managing a state of charge (SOC) based on a cause of deterioration of the battery and a method for managing the battery thereof. It will be appreciated by persons skilled in the art that the objects that could be achieved with the present invention are not limited to what has been particularly described hereinabove and the above and other objects that the present invention could achieve will be more clearly understood from the following detailed description.

To accomplish the object of the present invention, a vehicle according to an exemplary embodiment of the present invention may include: a memory configured to store vehicle information regarding vehicle driving; a battery configured to supply electrical energy to the vehicle; and a controller programmed to manage a state of charge (SOC) of the battery based on characteristics of usage of the battery. In particular, the controller may be configured to determine deterioration severity of the battery, determine a cause of deterioration of the battery when the deterioration severity is equal to or greater than a reference value, and manage the SOC of the battery based on the determined cause of deterioration.

Further, a method for managing a battery of a vehicle according to an exemplary embodiment of the present invention may include: detecting deterioration severity of the battery; determining whether the deterioration severity is equal to or greater than a reference value; determining a cause of deterioration of the battery when the deterioration severity is equal to or greater than the reference value; determining whether the cause of deterioration of the battery is vehicle driving; reducing an SOC management range of the battery when the cause of deterioration of the battery is charging/discharging due to vehicle driving; and determining that the cause of deterioration of the battery is a state of the vehicle left unattended and adjusting the central SOC of the battery when the cause of deterioration of the battery is not charging/discharging due to vehicle driving.

The aforementioned vehicle and the method for managing a battery thereof related to at least one exemplary embodiment of the present invention may minimize deterioration of the battery by managing SOC based on a cause of deterioration of the battery. It will be appreciated by persons skilled in the art that the effects that may be achieved with the present invention are not limited to what has been particularly described hereinabove and other advantages of the present invention will be more clearly understood from the following detailed description taken in conjunction with the accompanying drawings.

BRIEF DESCRIPTION OF THE DRAWINGS

The accompanying drawings, which are included to provide a further understanding of the invention and are incorporated in and constitute a part of this application, illustrate exemplary embodiment(s) of the invention and together with the description serve to explain the principle of the invention. In the drawings.

DETAILED DESCRIPTION

Figure 1:
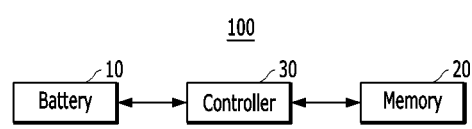
FIG. 1 is a block diagram illustrating a vehicle according to an exemplary embodiment of the present invention.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Furthermore, control logic of the present invention may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Now, the above and other aspects of the present invention will be described in detail through exemplary embodiments with reference to the accompanying drawings so that the present invention may be easily understood and realized by those skilled in the art. Modifications to the exemplary embodiment will be readily apparent to those of ordinary skill in the art, and the disclosure set forth herein may be applied to other embodiments and applications without departing from the spirit and scope of the present invention and the appended claims. In the following description of the present invention, a detailed description of known functions and configurations incorporated herein will be omitted when it may obscure the subject matter of the present invention. The same reference numbers will be used throughout this specification to refer to the same or like parts.

Hereinafter, a vehicle and a method for managing a battery thereof applicable to exemplary embodiments of the present invention will be described in detail with reference to FIGS. 1 to 8. FIG. 1 is a block diagram illustrating a vehicle according to the present invention.

As illustrated in FIG. 1, a vehicle 100 may include a battery 10, a memory 20 and a controller 30. In particular, the memory 20 may be configured to store various types of vehicle information regarding vehicle driving. The memory 20 may be configured to store mileage information of the vehicle, information regarding the time period for which the vehicle has been used, and information regarding a deterioration state of the battery and may further be configured to store a deterioration severity determination map, a deterioration cause determination map, a state of charge (SOC) management range change map and a central SOC change map generated by the controller 30 as necessary.

In addition, the battery 10 may be configured to supply electrical energy to the vehicle. The controller 30 may be programmed to control management of a SOC of the battery based on characteristics of usage of the battery 10. Particularly, the controller 30 may be configured to determine deterioration severity of the battery 10, determine a cause of deterioration of the battery 10 when the deterioration severity is equal to or greater than a reference value, and adjust the SOC of the battery 10 based on the determined cause of deterioration.

For example, the deterioration severity may be determined based on the state of health (SoH) of the battery 10 measured by the controller 30, as a ratio of a predetermined time period to a time period or a ratio of a predetermined mileage to a mileage in which the vehicle has been used. Particularly, the SoH may be defined as a value that the controller 30 measures the deterioration state of the battery 10 and stores in the memory 20, the predetermined time period or mileage may mean a time period or mileage guaranteed by the vehicle manufacturer corresponding to the SoH of the battery 10.

The controller 30 may be configured to determine a cause of deterioration of the battery 10 when the deterioration severity is equal to or greater than 1 which is the reference value.

Table 1 shows an example of the time period and mileage guaranteed by the vehicle manufacturer corresponding to the SoH of the battery 10.

|  | SoH(%) | | | | |
| --- | --- | --- | --- | --- | --- |
|  | 100 | 95 | 90 | 85 | 80 |
| Time period(year) | 0 | 2 | 5 | 10 | 15 |
| Mileage(km) | 0 | 40,000 | 100,000 | 200,000 | 300,000 |

For example, assuming that the measured SoH of the battery 10 is 95%, the time period is one year, and the mileage is 20,000 km in which the vehicle has been used, the deterioration severity is 2. Therefore, the controller 30 may be configured to determine the cause of deterioration of the battery 10.

Furthermore, when the controller 30 determines the deterioration severity, the controller 30 may be configured to collect vehicle information stored in the memory 20 to generate the deterioration severity determination map and determine the deterioration severity of the battery using the deterioration severity determination map. The vehicle information collected from the memory 20 may be mileage information of the vehicle, information regarding the time period for which the vehicle has been used or operated, and information regarding a deterioration state of the battery. For example, the deterioration severity determination map may include at least one of deterioration severity determined using the mileage of the vehicle and a battery deterioration state, deterioration severity determined using the time period for which the vehicle has been used and a battery deterioration state, and deterioration severity determined using the mileage of the vehicle, the time period for which the vehicle has been used and a battery deterioration state.

In particular, the controller 30 may be configured to determine deterioration severity using the mileage of the vehicle and a battery deterioration state, determine deterioration severity using the time period for which the vehicle has been used and a battery deterioration state or determine deterioration severity using the mileage of the vehicle, the time period for which the vehicle has been used and a battery deterioration state when generating the deterioration severity determination map. Thereafter, when determining the cause of deterioration of the battery 10, the controller 30 may be configured to collect the vehicle information stored in the memory 20 to generate the deterioration cause determination map and determine the cause of deterioration of the battery using the deterioration cause determination map.

The vehicle information collected from the memory 20 may be the mileage information of the vehicle and the time period for which the vehicle has been operated. For example, the deterioration cause determination map may include deterioration cause information determined by detecting the time period for which the vehicle has been used based on the mileage of the vehicle. In particular, the controller 30 may be configured to determine the cause of deterioration by detecting the time period for which the vehicle has been used based on the mileage of the vehicle when generating the deterioration cause determination map.

In addition, in the determination of the cause of deterioration of the battery, the controller 30 may be configured to determine charging/discharging of the battery based on vehicle driving as the cause of deterioration of the battery when the time period for which the vehicle has been used depending on the mileage of the vehicle is long (e.g., greater than a predetermined time period). For example, referring to the above-mentioned Table 1, assuming that the measured SoH of the battery 10 is 95%, the time period is 2 year, and the mileage is 20,000 km in which the vehicle has been used, it may be determined that the battery is deteriorated due to a busy charge/discharge.

In the determination of the cause of deterioration of the battery, the controller 30 may be configured to determine a state of the vehicle left unattended as the cause of deterioration of the battery when the time period for which the vehicle has been used depending on the mileage of the vehicle is short (e.g., less than a predetermined time period). For example, referring to the above-mentioned Table 1, assuming that the measured SoH of the battery 10 is 95%, the time period is 1 year, and the mileage is 40,000 km in which the vehicle has been used, it may be determined that the battery is deteriorated because the vehicle has been left unattended. The vehicle being left unattended may refer to a situation where the vehicle has been unused or not started for a substantial time period.

In control of management of the SOC of the battery based on the determined cause of deterioration, the controller 30 may be configured to reduce a SOC variance of the battery when the cause of deterioration is determined to be the charging/discharging of a battery based on vehicle driving (e.g., based on how the vehicle is driven causing charging/discharging of the vehicle battery). When reducing an SOC variance of the battery, the controller 30 may be configured to generate an SOC management range change map and reduce the SOC variance of the battery using the generated SOC management range change map.

For example, the SOC management range change map may include an SOC variation calculated using the upper limit SOC and the lower limit SOC of a battery deterioration degree managed in the vehicle. In addition, the controller 30 may be configured to change the central SOC of the battery when the cause of deterioration is the vehicle left unattended when adjusting the SOC of the battery based on the cause of deterioration. In particular, the controller 30 may be configured to generate the central SOC change map and change the central SOC of the battery using the generated central SOC change map. For example, the central SOC change map may include a new central SOC value calculated using the central SOC of the battery deterioration degree managed in the vehicle. In other words, the controller 30 may be configured to change the central SOC to a robust range.

As described above, the present invention may determine whether a main influence factor is deterioration due to driving or deterioration caused by a state of the vehicle left unattended when the battery has severely deteriorated, to suppress additional deterioration. Particularly, whether the battery has normally deteriorated or severely deteriorated is determined using a severe deterioration determination map. When the battery is determined to have deteriorated normally, whether a main cause of deterioration is an influence of driving or an influence of a state of the vehicle left unattended may be determined. When a main deterioration factor is determined, management control for suppressing deterioration may be performed based on the determined cause of deterioration.

For example, deterioration may be suppressed by reducing a SOC management range including the upper limit and lower limit when the deterioration is determined to be deterioration caused by driving, whereas the central SOC may be changed to a range robust to deterioration caused by a state of the vehicle left unattended when the deterioration is determined to be deterioration caused by a state of the vehicle left unattended. Accordingly, the present invention may suppress deterioration in consideration of characteristics of usage of the battery to mitigate battery deterioration depending on conditions of usage of a customer and to secure durability.

Figure 2:
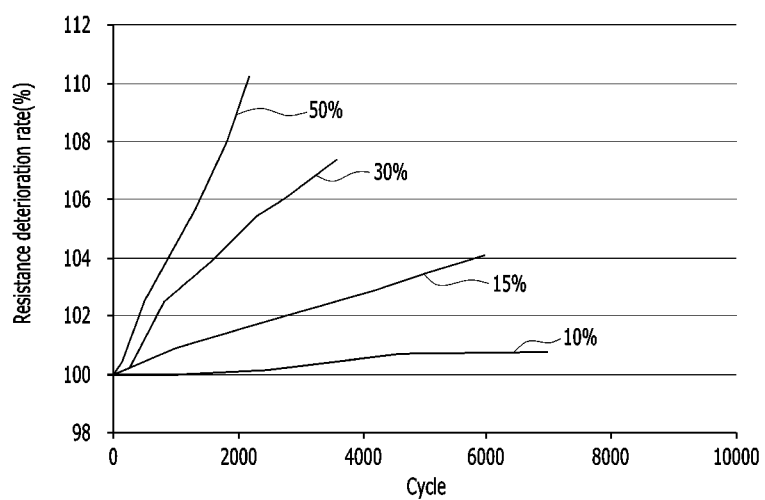
FIG. 2 is a graph showing deterioration of a battery according to vehicle driving according to an exemplary embodiment of the present invention.
Figure 3:
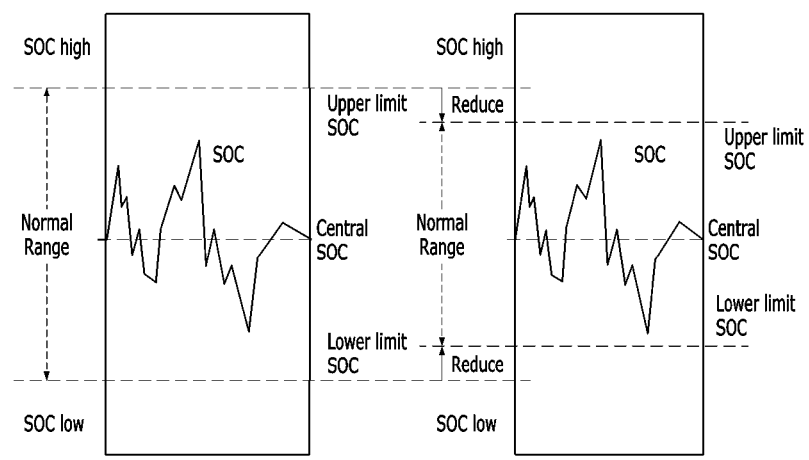
FIG. 3 is a graph showing reduction in SOC variance for suppressing battery deterioration according to vehicle driving according to an exemplary embodiment of the present invention.

FIG. 2 is a graph showing battery deterioration due to vehicle driving and FIG. 3 is a graph showing a reduction in the SOC variance for suppressing battery deterioration due to vehicle driving. As shown in FIG. 2, when the cause of deterioration of the battery is charging/discharging of the vehicle battery due to vehicle driving, the SOC variance is affected by acceleration of deterioration when the vehicle is driven. In other words, battery deterioration accelerates as the SOC variance increases, as shown in FIG. 2.

Accordingly, the present invention may reduce the SOC variance of the battery when the cause of battery deterioration is charging/discharging due to vehicle driving, as shown in FIG. 3. As shown in FIG. 3, the upper limit SOC and the lower limit SOC are set in the vehicle, and the SOC may change to an optimal efficiency point based on the central SOC. Accordingly, it may be possible to suppress acceleration of deterioration due to charging/discharging during vehicle driving by reducing the SOC variance including the upper limit SOC and the lower limit SOC.

Figure 4:
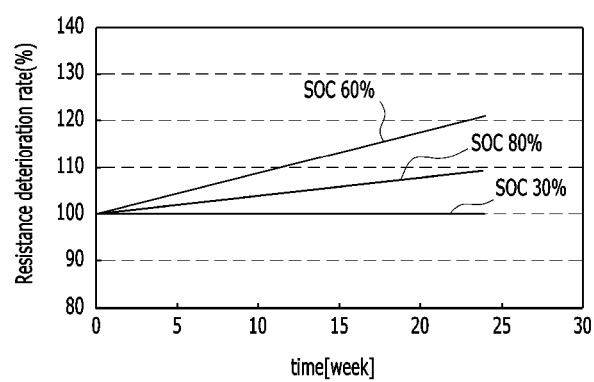
FIG. 4 is a graph showing deterioration of a battery caused by a vehicle left unattended according to an exemplary embodiment of the present invention.
Figure 5:
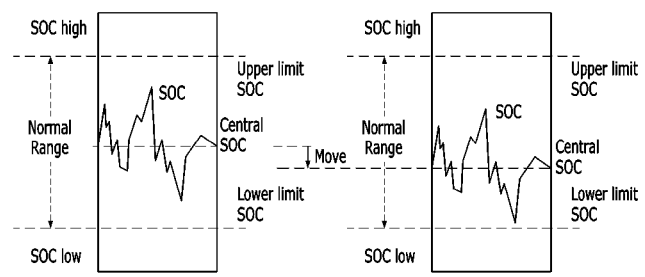
FIG. 5 is a graph showing a central SOC variance for suppressing battery deterioration caused by a vehicle left unattended according to an exemplary embodiment of the present invention.

FIG. 4 is a graph showing battery deterioration caused by a state of the vehicle left unattended and FIG. 5 is a graph showing a change of the central SOC for suppressing battery deterioration caused by a state of the vehicle left unattended. As shown in FIG. 4, when the cause of deterioration of the battery is a state of the vehicle left unattended, the SOC is affected by acceleration of deterioration when the vehicle is left unattended. In other words, deterioration of the battery accelerates as a time for which the vehicle is left unattended increases, as shown in FIG. 4.

Accordingly, the present invention may change the center SOC of the battery, as shown in FIG. 5, when the cause of deterioration of the battery is a state of the vehicle left unattended. In particular, the upper limit SOC and the lower limit SOC are set in the vehicle, and the SOC may change to the optimal efficiency point based on the central SOC, as shown in FIG. 5. Accordingly, it may be possible to suppress acceleration of deterioration occurring when the vehicle is left unattended during parking or stopping by adjusting the central SOC to a robust range.

Figure 6:
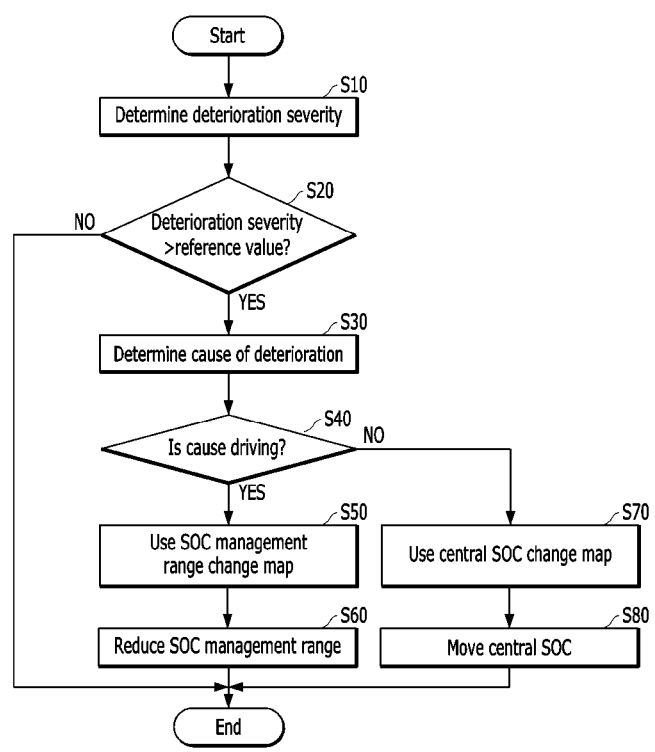
FIG. 6 is a flowchart illustrating a method for managing a battery of a vehicle according to an exemplary embodiment of the present invention.

FIG. 6 is a flowchart illustrating a method for managing a battery of a vehicle according to the present invention. As illustrated in FIG. 6, the controller may be configured to detect deterioration severity of the battery (S10). In particular, the controller may be configured to generate the deterioration severity determination map by collecting vehicle information stored in the memory and determine deterioration severity of the battery using the deterioration severity determination map.

In generation of the deterioration severity determination map, the controller may be configured to determine deterioration severity based on a battery deterioration state, determine deterioration severity based on the time period for which the vehicle has been operated and a battery deterioration state, or determine deterioration severity based on the mileage of the vehicle, the time period for which the vehicle has been operated and a battery deterioration state. Then, the controller may be configured to determine whether deterioration severity is equal to or greater than a reference value (S20). When deterioration severity is equal to or greater than the reference value, the controller may be configured to determine the cause of deterioration of the battery (S30).

In determination of the cause of deterioration of the battery, the controller may be configured to generate the deterioration cause determination map by collecting vehicle information stored in the memory and determine the cause of deterioration of the battery using the deterioration cause determination map. When generating the deterioration cause determination map, the controller may be configured to determine the cause of deterioration by detecting the time period for which the vehicle has been used based on the mileage of the vehicle. Thereafter, the controller may be configured to whether the cause of deterioration of the battery is vehicle driving (S40).

When the cause of deterioration of the battery is charging/discharging due to vehicle driving, the controller may be configured to reduce the SOC management range using the SOC management range change map (S50 and S60). When the cause of deterioration of the battery is not charging/discharging due to vehicle driving, the controller may be configured to determine that the cause of deterioration of the battery is a state of the vehicle left unattended and change the central SOC of the battery using the central SOC change map (S57 and S68).

Figure 7:
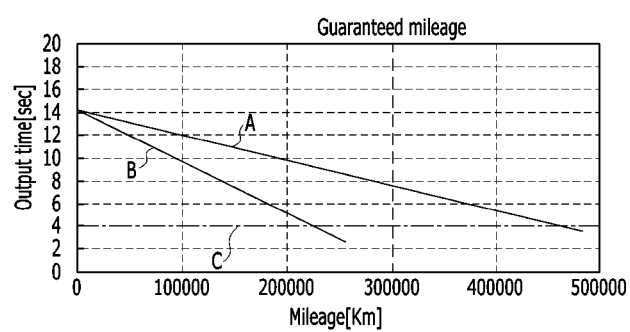
FIGS. 7 and 8 are graphs showing mileages depending on battery usage conditions according to an exemplary embodiment of the present invention.
Figure 8:
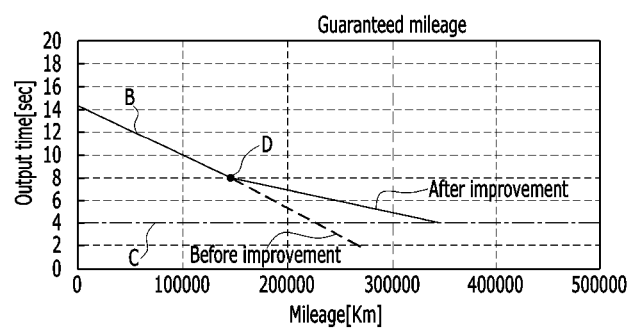

FIGS. 7 and 8 are graphs showing mileages depending on battery usage conditions. As shown in FIG. 7, the mileage of the vehicle is approximately 500,000 km with respect to a deterioration limit condition C when the battery is operated in a normal usage condition A, and the mileage of the vehicle is reduced to approximately 250,000 km with respect to the deterioration limit condition C when the battery is operated in a severe usage condition B. Additionally, when the battery SOC is managed through the battery management method according to the present invention, the mileage of the vehicle is improved to approximately 350,000 km with respect to the deterioration limit condition C when the battery is operated in the severe usage condition B, as shown in FIG. 8.

The aforementioned method according to the present invention may be implemented as a program executed in a computer and stored in a computer-readable recording medium. Examples of the computer-readable recording medium include a ROM, a RAM, a CD-ROM, a magnetic tape, a floppy disk, an optical data storage device, and a medium using a carrier wave (e.g. transmission over the Internet).

Those skilled in the art will appreciate that the present invention may be carried out in other specific ways than those set forth herein without departing from the spirit and essential characteristics of the present invention. The above exemplary embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein.

What is claimed is:

1. A vehicle, comprising:
   a memory configured to store vehicle information regarding vehicle driving;
   a battery configured to supply electrical energy to the vehicle; and
   a controller configured to manage a state of charge (SOC) of the battery based on characteristics of usage of the battery,
   wherein the controller is configured to:
   determine deterioration severity of the battery;
   determine a cause of deterioration of the battery when the deterioration severity is equal to or greater than a reference value;
   reduce an SOC variance of the battery according to the determined cause of deterioration of the battery, wherein the cause of deterioration is due to vehicle driving;
   change a central SOC of the battery according to the determined cause of deterioration of the battery, wherein the cause of deterioration is due to the vehicle being left unattended, and
   wherein the controller determines whether the deterioration of the battery is due to vehicle driving or a state of the vehicle left unattended.

2. The vehicle according to claim 1, wherein the controller is configured to determine a deterioration severity determination map by collecting the vehicle information stored in the memory and determine the deterioration severity of the battery using the deterioration severity determination map.

3. The vehicle according to claim 2, wherein the vehicle information collected from the memory includes information regarding mileage of the vehicle, information regarding a time period for which the vehicle has been operated, and information regarding a deterioration state of the battery.

4. The vehicle according to claim 2, wherein the deterioration severity determination map includes at least one selected from the group consisting of: deterioration severity determined using mileage of the vehicle and a deterioration state of the battery, deterioration severity determined using a time period for which the vehicle has been operated and the deterioration state of the battery, and deterioration severity determined using the mileage of the vehicle, the time period for which the vehicle has been operated and the deterioration state of the battery.

5. The vehicle according to claim 2, wherein the controller is configured to determine the deterioration severity using mileage of the vehicle and a deterioration state of the battery, determine the deterioration severity using a time period for which the vehicle has been operated and the deterioration state of the battery, or determine the deterioration severity using the mileage of the vehicle, the time period for which the vehicle has been operated and the deterioration state of the battery when generating the deterioration severity determination map.

6. The vehicle according to claim 1, wherein when determining the cause of deterioration of the battery, the controller is configured to generate a deterioration cause determination map by collecting the vehicle information stored in the memory and determine the cause of deterioration of the battery using the deterioration cause determination map.

7. The vehicle according to claim 6, wherein the vehicle information collected from the memory includes information regarding mileage of the vehicle and information regarding a time period for which the vehicle has been operated.

8. The vehicle according to claim 6, wherein the deterioration cause determination map includes information regarding the cause of deterioration determined by detecting a time period for which the vehicle has been operated based on mileage of the vehicle.

9. The vehicle according to claim 6, wherein the controller is configured to determine the cause of deterioration by detecting a time period for which the vehicle has been operated based on mileage of the vehicle when generating the deterioration cause determination map.

10. The vehicle according to claim 1, wherein the controller is configured to determine that the cause of deterioration of the battery is the charging/discharging of the battery due to vehicle driving when a time period for which the vehicle has been operated based on mileage of the vehicle is greater than a predetermined time period.

11. The vehicle according to claim 1, wherein the controller is configured to determine that the cause of deterioration of the battery is the state of the vehicle left unattended when a time period for which the vehicle has been operated based on mileage of the vehicle is less than a predetermined time period.

12. The vehicle according to claim 1, wherein the controller is configured to reduce the SOC variance corresponding to a difference between an upper limit SOC and a lower limit SOC of the battery when the determined cause of deterioration is the charging/discharging of the battery due to vehicle driving.

13. The vehicle according to claim 12, wherein the controller is configured to generate a SOC management range change map and reduce the SOC variance of the battery using the generated SOC management range change map.

14. The vehicle according to claim 13, wherein the SOC management range change map includes a SOC variation calculated using the upper limit SOC and the lower limit SOC of battery deterioration managed in the vehicle.

15. The vehicle according to claim 1, wherein the central SOC of the battery is between an upper limit SOC and a lower limit SOC of the battery.

16. The vehicle according to claim 15, wherein the controller is configured to generate a central SOC change map and change the central SOC of the battery using the generated central SOC change map.

17. The vehicle according to claim 16, wherein the central SOC change map includes a new central SOC value calculated using the central SOC of battery deterioration managed in the vehicle.

18. The vehicle according to claim 15, wherein the controller is configured to change the central SOC of the battery to a robust range.

19. A method for managing a battery of a vehicle including a battery supplying electrical energy, comprising:
   detecting, by a controller, deterioration severity of the battery;
   determining, by the controller, whether the deterioration severity is equal to or greater than a reference value;
   determining, by the controller, a cause of deterioration of the battery when the deterioration severity is equal to or greater than the reference value;
   reducing, by the controller, a SOC variance corresponding to a difference between an upper limit SOC and a lower limit SOC of the battery according to the determined cause of deterioration of the battery, wherein the cause of deterioration is due to vehicle driving; and
   changing, by the controller, a central SOC between the upper limit SOC and the lower limit SOC of the battery according to the determined cause of deterioration of the battery, wherein the cause of deterioration is due to the vehicle being left unattended,
   wherein the controller determines whether the cause of deterioration of the battery is due to vehicle driving or a state of the vehicle left unattended.

* * * * *